United States Patent [19]

Shigekane et al.

[11] Patent Number: 4,945,396
[45] Date of Patent: Jul. 31, 1990

[54] SEMICONDUCTOR DEVICE HAVING DARLINGTON TRANSISTORS

[75] Inventors: Hisao Shigekane; Shinichi Ito, both of Kanagawa, Japan

[73] Assignee: Fuji Electric Co., Ltd., Kanagawa, Japan

[21] Appl. No.: 449,412

[22] Filed: Dec. 15, 1989

Related U.S. Application Data

[63] Continuation of Ser. No. 123,917, Nov. 23, 1987, abandoned.

[30] Foreign Application Priority Data

Dec. 15, 1986 [JP] Japan .................................. 61-297895
Mar. 18, 1987 [JP] Japan .................................. 62-63590

[51] Int. Cl.⁵ ..................... H01L 27/02; H01L 29/72; H01L 29/747
[52] U.S. Cl. .......................................... 357/46; 357/34; 357/39; 307/315
[58] Field of Search ........................ 357/46, 34, 35, 39; 307/315

[56] References Cited

U.S. PATENT DOCUMENTS 3,657,577  4/1972  Wakai et al. ................... 307/315
4,616,144  10/1986  Hideshima et al. ............. 307/315
4,695,807  9/1987  Annacker et al. ............... 307/315
4,769,560  9/1988  Tani et al. ...................... 357/46

FOREIGN PATENT DOCUMENTS 57-145355  9/1982  Japan ........................... 357/46
58-81313   5/1983  Japan .
58-222569  12/1983  Japan ........................... 357/46

Primary Examiner—Andrew J. James
Assistant Examiner—Ngan Van Ngo
Attorney, Agent, or Firm—Finnegan, Henderson, Farabow, Garrett, and Dunner

[57] ABSTRACT

A semiconductor device, CHARACTERIZED in that a Darlington transistor in which in one surface of a semiconductor of a first conductivity type, base regions of a second conductivity type, the number of which is larger that the number of base-emitter junctions of the transistor, are formed, emitter regions of the first conductivity type are formed in the base regions, respectively, and base electrodes and emitter electrodes are connected to the base regions and emitter regions, respectively, and are further connected in such a manner that the base electrode of a base region is connected to the emitter electrode in the next base region, is the same in conductivity type arrangement as the transistor and is mounted on the same substrate as the transistor in such a manner that the Darlington transistor is insulated from the transistor, and the base electrode of the transistor is connected to the collector electrode of the Darlington transistor which is formed on the other surface of the semiconductor and to the base electrode of the Darlington transistor which is located at the end of the Darlington transistor and is connected to none of the emitter electrodes of the Darlington transistor, while the emitter electrode of the transistor is connected to the emitter electrode of the Darlington transistor which is located at the end of the Darlington transistor and is connected to none of the base electrodes of the Darlington transistor.

6 Claims, 4 Drawing Sheets

SEMICONDUCTOR DEVICE HAVING DARLINGTON TRANSISTORS

This application is a continuation, of application Ser. No. 07/123,917, filed Nov. 23, 1987, now abandoned.

BACKGROUND OF THE INVENTION

This invention relates to a semiconductor device in which the collector current of a transistor is limited to not become excessively large.

A circuit for limiting the collector current of a transistor even while the collector-emitter voltage or the base current of the transistor changes, has been disclosed by Japanese Patent Application (OPI) No. 81313/1983 (the term "OPI" as used herein means an "unexamined published application"). In the circuit, as shown in FIG. 2, one end of a collector current detecting resistor 22 is connected in series to the emitter of a transistor 21, and a series circuit of two diodes 23 and 24 is connected between the base of the transistor 21 and the other end of resistor 22. It is assumed that the resistance of the resistor 22 is represented by R, the collector current flowing in the resistor 22 by $I_C$, the base-emitter voltage of the transistor 21 by $V_{BEO}$, and the sum of the forward voltage of the diodes 23 and 24 by $V_F$. When the collector current $I_C$ increases to satisfy the following equation $$V_{BEO} + R \cdot I_C = V_F,$$

a current $I_1$ flows in the diodes 23 and 24, and of the base input current $I_B$, only $I_O = I_B - I_1$ flows in the transistor 21. As a result, the collector current is limited as follows:

$$, I_C = (V_F - V_{BEO})/R \tag{1}$$

Therefore, in this case, the collector current-collector-emitter voltage characteristic curve is as indicated by the solid line 31 in FIG. 3, being much different from that indicated by the dotted line 32 which is provided when no diode is connected to the transistor. That is, the collector current $I_C$ shows a constant current characteristic.

The above-described circuit may be formed as a semiconductor device by the following methods: In one of the methods, as shown in FIG. 4, a transistor 1 is fixedly secured through a copper plate 3 to an insulating substrate 2, and two diode elements 61 and 61 are connected between a base terminal conductor 51 connected through a lead wire 4 to the base electrode 11 of the transistor 1 and an emitter terminal conductor 52 connected to the emitter electrode 12 of the transistor 1. In the other method, as shown in FIG. 5, a transistor 1 and two diode chips 62 and 62 are secured through copper plates 3 to an insulating substrate 2 formed on a copper substrate 30, and a base terminal conductor 51 and an emitter terminal conductor 52 are formed on the insulating substrate 2, and these circuit elements 1, 62, 51 and 52 are connected through conductors 4 as shown in FIG. 5.

In these methods, it is necessary to use two diode elements 61 or two diode chips 62, and to connect them as described above. Therefore, the resultant semiconductor device (module) is unavoidably bulky. For the purpose of eliminating this difficulty, the following semiconductor device has been proposed in the art. The device uses one chip in which two diodes are connected in series. That is, as shown in FIG. 6(a), two P-type layers 64 and 64 are formed in an N-type semiconductor pellet 63, and N-type layers 65 are formed in the P-type layers 64, respectively, and one of the P-type layers 64 is connected to the N-type layer 65 in the other P-type layer 64 with a conductor 7. Thereafter, as shown in FIG. 6(b), the chip 6 thus formed is secured to the insulating substrate 2, and the other P-type layer 64 is connected to the base terminal conductor 51 while the N-type layer 65 in the one P-type layer 64 is connected to the emitter terminal conductor 52. In the module thus formed, the area occupied by the diodes is smaller and the number of bonding points of the lead wires 4 is smaller than those in the module shown in FIG. 5.

In the conventional semiconductor devices described above, the diodes connected in series are provided between the base and the emitter of the transistor for limiting the collector current. When the base current changes, the forward voltage of each of the diodes is changed and the sum $V_F$ of the forward voltages of the diodes becomes the product of the voltage variation and the number of diodes. Therefore, the collector current $I_C$ determined by the above-described equation (1) is changed, so that the current limit value changes.

SUMMARY OF THE INVENTION

Accordingly, an object of this invention is to eliminate the above-described difficulty accompanying a conventional semiconductor device. More specifically, an object of the invention is to provide a semiconductor device in which the variation in collector current limit value of the transistor due to the change of the base current is minimized.

The foregoing object of the invention has been achieved by the provision of a semiconductor device having a function of limiting the collector current of a transistor, in which a Darlington transistor comprising a semiconductor of a first conductivity type, base regions of a second conductivity type formed in one surface of the semiconductor, the number of the base regions being larger than the number of base-emitter junctions of the transistor, emitter regions of the first conductivity type formed in the base regions, respectively, and base electrodes and emitter electrodes provided on the base regions and the emitter regions, respectively, the base electrode of a base region being connected to the emitter electrode in the next base region, is the same in conductivity type arrangement as the transistor and is mounted on the same substrate as the transistor in such a manner that the Darlington transistor is insulated from the transistor, and the base electrode of the transistor is connected to the collector electrode of the Darlington transistor which is formed on the other surface of the semiconductor and to the base electrode of the Darlington transistor which is located at the end of the Darlington transistor and is connected to none of the emitter electrodes of the Darlington transistor, while the emitter electrode of the transistor is connected to the emitter electrode of the Darlington transistor which is located at the end of the Darlington transistor and is connected to none of the base electrodes of the Darlington transistor.

In the semiconductor device thus constructed, the base and the emitter of the Darlington transistor are connected to the base and the emitter of the transistor, respectively, so that the series-connected base-emitter junctions serve as the series-connected diodes in the conventional semiconductor device. The excessive base current $I_1$ for limiting the collector current of the main transistor flows from collector to emitter in the Darlington transistor. Therefore, the current flowing in the base-emitter junction is $I\beta$ (where $\beta$ is the current amplification factor of the Darlington transistor), and the variation of the corresponding over voltage VF due to the variation of $I_1$ is also decreased. Therefore, the variation of the limit value of the collector current Ic determined according to equation (1)can be suppressed.

BRIEF DESCRIPTION OF THE DRAWINGS

FIG. 5 is a sectional view showing another example of the conventional semiconductor device corresponding to the circuit of FIG. 2, FIGS. 6(a) and 6(b) show still another example of the conventional semiconductor device, in which

DETAILED DESCRIPTION OF THE PREFERRED EMBODIMENTS

Figure 1A:
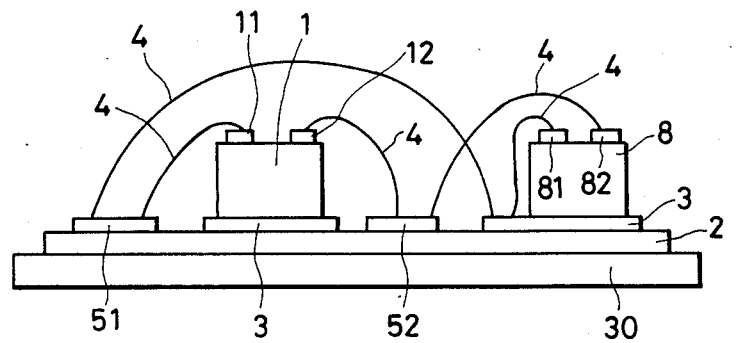
FIG. 1(a) is a front view of the first embodiment of the present invention.
Figure 1B:
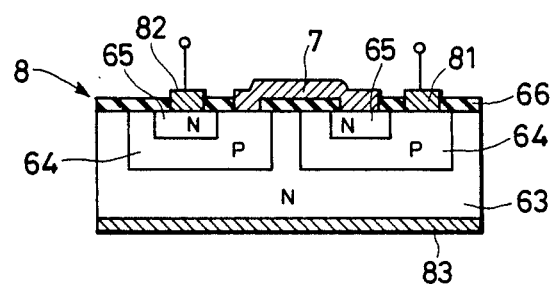
FIG. 1(b) is a sectional view of a Darlington transistor shown in FIG. 1(a)
Figure 2:
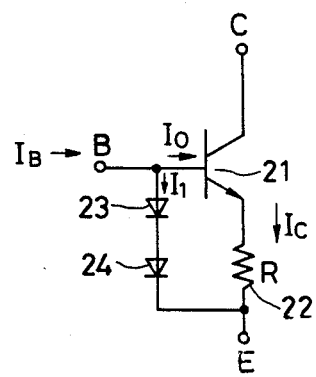
FIG. 2 is an equivalent circuit of a conventional current limit semiconductor device.
Figure 3:
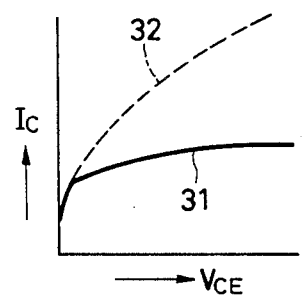
FIG. 3 is a graphical representation indicating collector current versus collector-emitter voltages for a description of the current limit effect of the device shown in FIG. 2.
Figure 4:
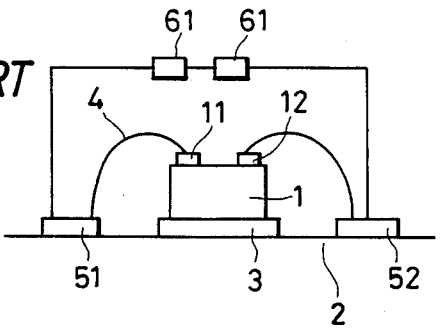
FIG. 4 is a front view of one example of a semiconductor device corresponding to the circuit of FIG. 2.
Figure 5:
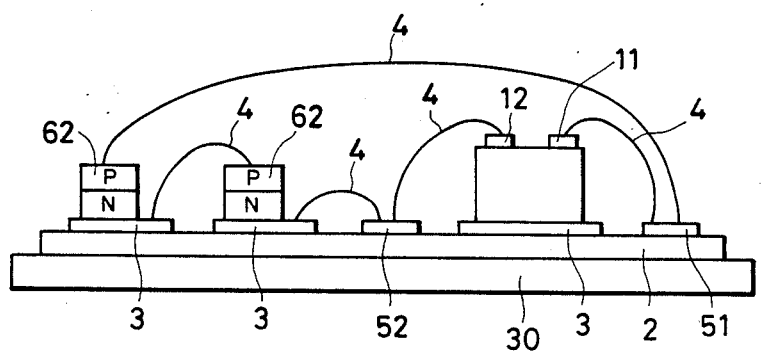
Figure 6A:
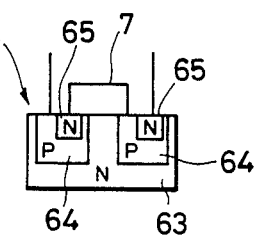
FIG. 6(a) is a sectional view of a diode chip used in the semiconductor device.
Figure 6B:
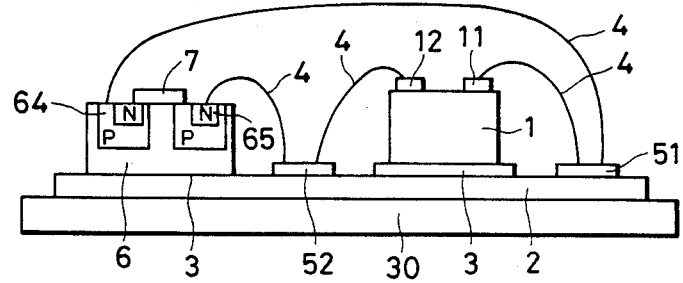
FIG. 6(b) is a sectional view of the semiconductor device.

A first embodiment of this invention is as shown in FIGS. 1(a) and 1(b), in which parts corresponding functionally to those which have been already described with reference to FIGS. 4, 5 and 6 are designated by the same reference numerals or characters.

As shown in FIG. 1(a), an NPN type transistor 1 is secured through a copper plate 3 to a ceramic plate 2 formed on a copper substrate 30. The base electrode 11 and the emitter electrode 12 of the transistor 1 are connected through lead wires 4 to a base terminal conductor 51 and an emitter terminal conductor 52, respectively. Furthermore, according to the invention, an NPN Darlington transistor 8 is secured through a copper plate 3 to the insulating substrate 2. FIG. 1(b) shows the structure of the Darlington transistor 8, which is similar to that of the chip 6 shown in FIG. 6. The structure will be described in more detail. Two P-type layers (regions) 64 are formed in one N-type semiconductor pellet 63, and an N-type layer 65 is formed in each of the P-type layers 64. One of the P-type layers 64 is connected to the N-type layer 65 in the other P-type layer 64 with a conductor 7 laid between openings of an oxide film 66. A base electrode 81 is formed on the other P-type layer 64, and an emitter electrode 82 is formed on the N-type layer 65 in the one P-type layer 64. A collector electrode 83 is formed on the lower surface of the pellet 63.

Figure 7:
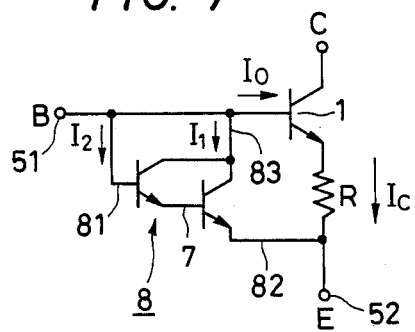
FIG. 7 is an equivalent circuit diagram of the first embodiment of the invention shown in FIG. 1.

The base electrode 81 of the Darlington transistor 8 is short-circuited through the copper plate 3 to the collector electrode 83 and is connected through a lead wire 4 to the base terminal conductor 51. The emitter electrode 82 of the Darlington transistor 8 is connected through a lead wire 4 to the emitter terminal conductor 52. Therefore, an equivalent circuit of the semiconductor device thus constructed is as shown in FIG. 7, in which the circuit elements are designated by the same reference numerals as those in FIG. 1. A current $I_2$ flowing into the base electrode 81 of the Darlington transistor 8 is $I_1/\beta$ (where $\beta$ is the current amplification factor), and the sum of the forward voltages of the two base-emitter junctions is therefore smaller than that provided by $I_1$. That is, the dynamic resistance is decreased, and the forward voltage variation against the base current variation is also decreased, as a result of which the limit value variation of the collector current $I_C$ is also reduced.

Figure 8:
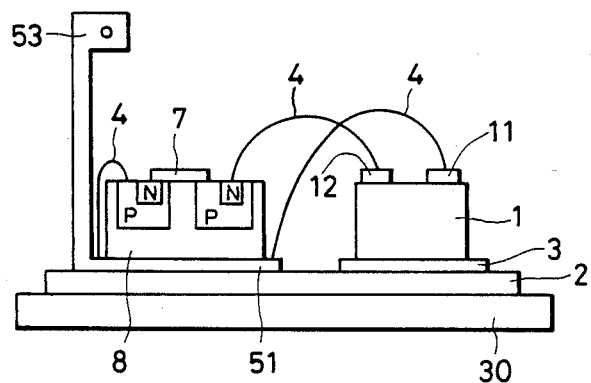
FIG. 8 is a sectional view showing a second embodiment of the invention.

FIG. 8 shows a second embodiment of the invention. In the second embodiment, the Darlington transistor 8 is fixedly mounted on the base terminal conductor 51 to which the base electrode 11 of the transistor 1 is connected. The base terminal conductor 51 is extended out of the module capsule to form an external terminal 53. Owing to this structure, the copper plate 3 provided under the Darlington transistor in FIG. 1 can be eliminated, the area of the module can be decreased, and the number of lead wires 4 can be reduced to three (from five in the first embodiment) in the second embodiment.

Figure 9:
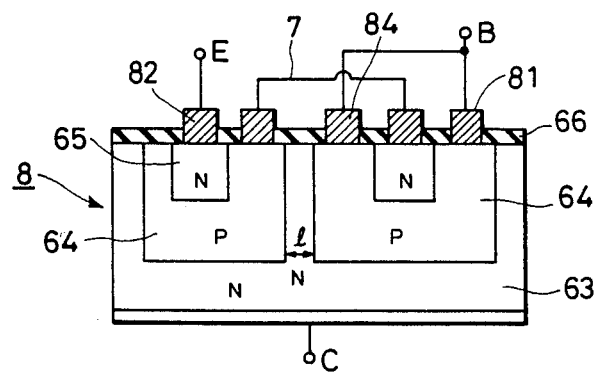
FIG. 9 is a sectional view showing a Darlington transistor employed in a third embodiment of the invention.
Figure 10:
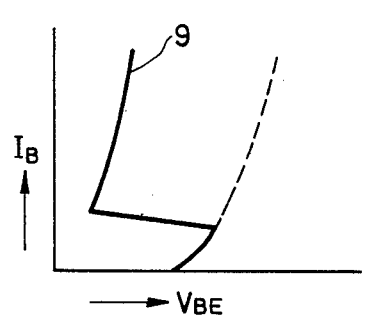
FIG. 10 is a graphical representation indicating the base-emitter input characteristic of the Darlington transistor shown in FIG. 9.
Figure 11:
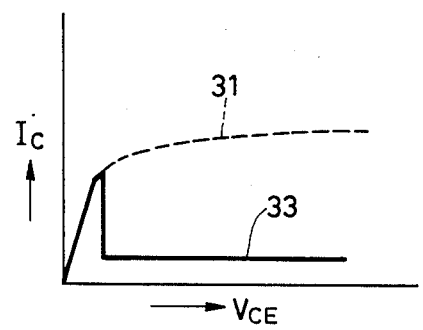
FIG. 11 is also a graphical representation indicating collector current versus collector-emitter voltage in the embodiment using the Darlington transistor shown in FIG. 9.

FIG. 9 shows a Darlington transistor 8 in a third embodiment of the invention. In this case, an electrode 84 is provided on the base region 64 of the front stage transistor (at the right side of FIG. 9) near the base region 64 of the rear stage transistor (at the left side of FIG. 9). The electrode 84 is connected to the base electrode 81 of the Darlington transistor 8 so that it is equal in potential to the base electrode. The width $\beta$ of the part of an N-type layer 63 which is located between the base regions 64 of the front and rear transistors, namely, a common collector region is made small. Thus, the P-type layer of the base region 64 of the front stage transistor to which the base electrode 84 is connected, the N-type layer 63 of the common collector region, the P-type layer of the base region 64 of the rear stage transistor, and the N-type layer of the emitter region 65 of the rear stage transistor to which the emitter electrode 82 is connected, provide a PNPN thyristor effect. That is, the Darlington transistor has two transistors arranged vertically and one thyristor arranged horizontally. Its base-emitter input characteristic curve is as indicated by the solid line 9 in FIG. 10. That is, although having a threshold voltage, because of the thyristor effect, the base-emitter voltage $V_{BE}$ is abruptly decreased due to the flow of a small base current. Accordingly, the output characteristic of the transistor 1 is as indicated by the solid line 33 in FIG. 11; that is, after detection of an overcurrent, the limit value against the collector current $I_C$ is smaller than the over-current detection value, and therefore the transistor 1 can withstand a higher overcurrent than that in the above-described embodiments.

Figure 12:
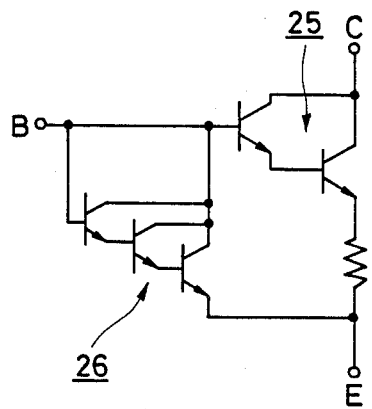
FIG. 12 is an equivalent circuit diagram of a fourth embodiment of the invention.

FIG. 12 is an equivalent circuit of a fourth embodiment of the invention. In this embodiment, the main transistor is a two-stage Darlington transistor 25, and a three-stage Darlington transistor 26 is connected between the base and the emitter of the main transistor 25. The current control effect is substantially similar to that of the above-described embodiments.

In FIG. 1(b), the front stage transistor and the output stage transistor of the Darlington transistor are shown equal in size. However, the Darlington transistor may be so designed that the final stage transistor is largest in size, and the transistors of the remaining stages are decreased in size in proportion to the reciprocal of the current amplification factor. This becomes more effective as the number of stages in the Darlington transistor to be inserted becomes larger.

In the semiconductor device of the invention, instead of the series-connected diodes connected between the base and the emitter of a transistor for limiting the collector current of the transistor, the Darlington transistor in the form of a chip, the number of stages of which is larger at least by one than the number of base-emitter junctions of the transistor, is mounted on the substrate on which the transistor is provided. Therefore, the semiconductor device of the invention is compact in structure, and is small in the variation of the current limit value due to the base current variation.

What is claimed is:

1. A semiconductor device comprising:
    a substrate having an insulating layer;
    a first transistor of a first type mounted on said insulating layer and having a first base electrode, a first collector electrode, and a first emitter electrode;
    Darlington transistor means of said first type having an external base region, an external collector region, and an external emitter region, and comprising a plurality of Darlington connected second transistors each of second transistors having a base region of a second conductivity type formed in a semiconductor layer of a first conductivity type, a collector region being part of said semiconductor layer and being common to all of said second transistors, and an emitter region of said first conductivity type formed in each of said base regions, said Darlington transistor means being mounted on said insulating layer and insulated from said first transistor;
    a second base electrode connected to said external base region;
    a second collector electrode connected to said external collector region;
    a second emitter electrode connected to external emitter region; and
    connecting means for coupling said first base electrode to said second collector electrode and said second base electrode, and for coupling said first emitter electrode to said second emitter electrode;
    wherein the collector current of said first transistor is limited by a reference voltage applied by said Darlington transistor means between said first base electrode and said first emitter electrode.

2. A semiconductor device of claim wherein said second base electrode further includes two interconnected contact points connected to opposite ends of said external base region and wherein said base regions of said second transistors are located in sufficiently close proximity to each other to result in said Darlington transistor means having a thyristor effect.

3. A semiconductor device of claim 1 wherein said first transistor comprises a plurality of Darlington connected third transistors and wherein the number of second transistors exceeds the number of third transistors by one.

4. A semiconductor device of claim 1 wherein said first type is NPN.

5. A semiconductor device of claim 1 wherein said first type is PNP.

6. A semiconductor device as claimed in claim 1, in which said Darlington transistor means is mounted through a base terminal conductor connected to the base electrode of said first transistor, said base terminal conductor being integral with an external terminal.

* * * * *

UNITED STATES PATENT AND TRADEMARK OFFICE
CERTIFICATE OF CORRECTION

PATENT NO. : 4,945,396
DATED : July 31, 1990
INVENTOR(S) : Hisao Shigekane et al.

It is certified that error appears in the above-identified patent and that said Letters Patent is hereby corrected as shown below:

Claim 2, column 6, line 22, insert --1-- after "claim."

Signed and Sealed this

Fifteenth Day of December, 1992

*Attest:*

DOUGLAS B. COMER

*Attesting Officer*   Acting Commissioner of Patents and Trademarks